(12) United States Patent
Park et al.

(10) Patent No.: US 6,743,676 B2
(45) Date of Patent: Jun. 1, 2004

(54) METHOD OF FORMING A FLOATING GATE IN A FLASH MEMORY DEVICE

(75) Inventors: Sung Kee Park, Sangju-Shi (KR); Ki Seog Kim, Ichon-Shi (KR); Keun Woo Lee, Ichon-Shi (KR); Keon Soo Shim, Ichon-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/286,980

(22) Filed: Nov. 4, 2002

(65) Prior Publication Data

US 2003/0124800 A1 Jul. 3, 2003

(30) Foreign Application Priority Data

Dec. 28, 2001 (KR) .......................................... 2001-86878

(51) Int. Cl.[7] .............................................. H01L 21/336
(52) U.S. Cl. ........................ 438/257; 438/259; 438/263; 438/424; 438/426
(58) Field of Search ................................ 438/257, 258, 438/259, 263, 264, 424, 425, 426

(56) References Cited

U.S. PATENT DOCUMENTS

| | | | | |
|---|---|---|---|---|
| 5,840,607 A | * | 11/1998 | Yeh et al. | 438/257 |
| 6,133,601 A | * | 10/2000 | Watanabe | 257/314 |
| 6,153,472 A | * | 11/2000 | Ding et al. | 438/264 |
| 6,153,494 A | * | 11/2000 | Hsieh et al. | 438/424 |
| 6,274,434 B1 | * | 8/2001 | Koido et al. | 438/266 |
| 6,326,263 B1 | * | 12/2001 | Hsieh | 438/257 |
| 6,451,654 B1 | * | 9/2002 | Lin et al. | 438/266 |
| 6,475,894 B1 | * | 11/2002 | Huang et al. | 438/593 |
| 6,495,853 B1 | * | 12/2002 | Holbrook et al. | 257/30 |
| 6,548,374 B2 | * | 4/2003 | Chung | 438/424 |
| 6,559,008 B2 | * | 5/2003 | Rabkin et al. | 438/257 |
| 6,573,153 B2 | * | 6/2003 | Maeda | 438/427 |
| 2001/0031559 A1 | * | 10/2001 | Koido et al. | 438/703 |
| 2002/0086496 A1 | * | 7/2002 | Nagatani et al. | 438/424 |

* cited by examiner

*Primary Examiner*—Matthew Smith
*Assistant Examiner*—Renzo Rocchegiani
(74) *Attorney, Agent, or Firm*—Jacobson Holman PLLC

(57) ABSTRACT

The present invention relates to a method of forming a floating gate in a flash memory device. Upon formation of a device isolation film, a space of a lower polysilicon layer for a floating gate is defined, a bird's beak is formed on an internal surface of a trench by subsequent well sacrificial oxidization process and well oxidization process and an upper polysilicon layer for a floating gate is then formed, so that the space of the floating gate is formed. Therefore, the present invention can reduce the cost since a mask process is not required compared to an existing stepper method and the process cost since a planarization process using chemical mechanical polishing process (CMP) is not required compared to the self-aligned floating mode.

11 Claims, 3 Drawing Sheets

METHOD OF FORMING A FLOATING GATE IN A FLASH MEMORY DEVICE

BACKGROUND OF THE INVENTION

1. Field of the Invention

The invention relates generally to a method of forming a floating gate in a flash memory device, and more particularly to, a method of forming a floating gate in a flash memory device capable of securing a space of the floating gate.

2. Description of the Prior Art

Generally, a method of manufacturing a flash memory device usually includes forming a device isolation film and then forming a polysilicon layer for a floating gate. The floating gate is formed by first etching the polysilicon layer for the floating gate, defining a gate electrode and then performing a self-aligned etch (SAE) process to form the polysilicon layer for the floating gate below a gate electrode. Recently, a method of forming the floating gate using a stepper mode and a method of forming the floating gate using a self-aligned floating gate mode have been widely employed in order to secure a space of the polysilicon layer for the floating gate.

The method using the stepper mode is one by which the polysilicon layer for the floating gate is deposited and a space is then defined through a mask process, wherein the polysilicon layer for the floating gate is defined as a bar type. At this time, the most import factor lies in how the space between neighboring polysilicon layers for the floating gates are defined to be narrow. This method has an advantage that the space between the polysilicon layers for the floating gates can be surely defined. This method, however, requires the mask process. Further, this method requires an expensive stepper as the design rule is reduced. Due to this, there is a problem that the cost of the flash memory device is increased.

Meanwhile, the method using the self-aligned floating gate mode is one by which the polysilicon layer for the floating gate is defined by a wet dip and poly chemical mechanical polishing (CMP) process without using the mask process. This method has an advantage that it does not require the stepper since the mask process is not performed. In this method, however, variation in the space may be hard depending on the wet dip time. Further, the process cost is increased since a poly CMP process is required. In addition, as an overlay between the polysilicon layer for the floating gate and a field oxide (FOX) film is determined by the wet dip, a hard moat is generated. A portion where the moat is generated, into which a channel ion is not injected, adversely affects an operation of a subsequent flash memory device.

In particular, in the method using the self-aligned floating gate mode, an erase operation of the flash memory device is problematic due to generation of the moat. If the coupling ratio is reduced, more higher bias is required upon a 0 erase operation. This increases the size of the capacitor in the flash memory device, thus causing the chip size to increase. In this connection, when all the flash memory devices are designed, it is important to secure the coupling ratio by maximum.

At this time, the capacitor of the flash memory device includes a capacitor (Cg) between the floating gate and the control gate, an overlay capacitor (Cd) between the floating gate and the drain junction region, an overlay capacitor (Cs) between the floating gate and the source junction region, a FOX capacitor (Cb) between the floating gate and the semiconductor substrate, and a free charge capacitor (Cf).

The total capacitor (Ct) of the above capacitors can be expressed as the following mathematical equation 1.

$$Ct = Cg + Cd + Cs + Cb + Ct \qquad \text{[Equation 1]}$$

Further, the gate-coupling ratio (kg) can be expressed as the following equation 2.

$$kg = Cg/Ct \qquad \text{[Equation 2]}$$

The reason why the gate-coupling ratio is important upon the erase operation, is that the voltage (Vg) applied to the control gate is expressed as the floating gate voltage (Vfg) defined as the following equation 3.

$$Vfg = kg \times Vg \qquad \text{[Equation 3]}$$

F-N (Fowler-Nordheim) tunneling is determined by the difference in the voltage between the control gate and the semiconductor substrate. Actually, F-N tunneling depends on a bias applied to the floating gate. Further, factors affecting the gate-coupling ratio include the thickness of the dielectric film having an oxide/nitride/oxide (ONO) structure and the area of the dielectric film surrounding the semiconductor substrate and the floating gate. The capacitor of the dielectric film is very important compared to other capacitors.

SUMMARY OF THE INVENTION

The present invention is contrived to solve the above problems and an object of the present invention is to provide a method of forming a floating gate in a flash memory device, capable of reducing the cost with no use of a mask process compared to an existing stepper method and reducing the process cost with no use of a planarization process using a chemical mechanical polishing process (CMP) compared to a self-aligned floating mode, in such a way that upon formation of a device isolation film, a space of a lower polysilicon layer for a floating gate is defined, a bird's beak is formed on an internal surface of a trench by means of subsequent well sacrificial oxidization process and well oxidization process and an upper polysilicon layer for a floating gate is then formed, so that the space of the floating gate is formed.

In order to accomplish the above object, a method of forming a floating gate in a flash memory device according to the present invention, is characterized in that it comprises the steps of forming a tunnel oxide film on a semiconductor substrate; forming a lower polysilicon layer on the tunnel oxide film; forming a pad oxide film and a pad nitride film on lower polysilicon layer; forming a trench on the semiconductor substrate; forming an oxide film on the entire structure to bury the trench and then performing a planarization process; performing a first etch process to remove the pad nitride film and the pad oxide film and simultaneously to over-etch the oxide film; and forming an upper polysilicon layer on the entire structure and performing a second etch process to form a floating gate.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
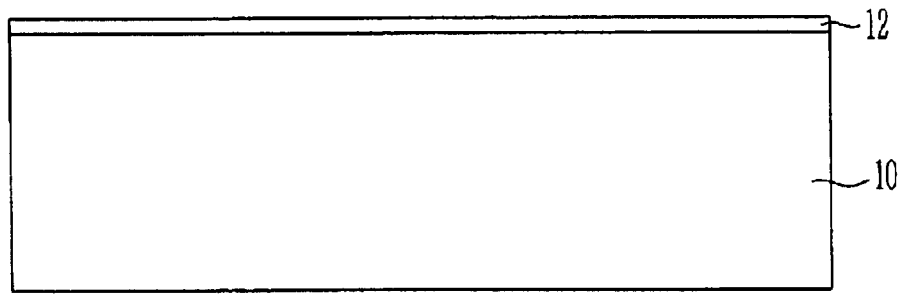
FIG. 1A through FIG. 1G are cross-sectional views of flash memory devices for illustrating a method of forming a floating gate in the flash memory device according to an embodiment of the present invention.

The present invention will be described in detail by way of a preferred embodiment with reference to accompanying drawings, in which like reference numerals are used to identify the same or similar parts.

FIG. 1A through FIG. 1G are cross-sectional views of flash memory devices for illustrating a method of forming a floating gate in the flash memory device according to an embodiment of the present invention.

Referring now to FIG. 1A, a buffer oxide film 12 of about 50 Å in thickness is formed on a semiconductor substrate 10. A well region and an impurity region (not shown) are then formed by a ion implantation process for forming a well and a ion implantation process for controlling threshold voltage. At this time, the ion implantation process for controlling threshold voltage includes performing an ion implantation process after a mask is formed only in a cell region.

Meanwhile, before the buffer oxide film 12 is formed, the semiconductor substrate 10 may be experienced by a pre-processing cleaning process using diluted HF (DHF, a HF solution into which $H_2O$ is diluted at a ratio of 50:1) or buffer oxide etchant (BOE, a solution in which HF and $NH_4F$ are mixed at a ratio of 100:1 or 300:1).

Figure 1B:
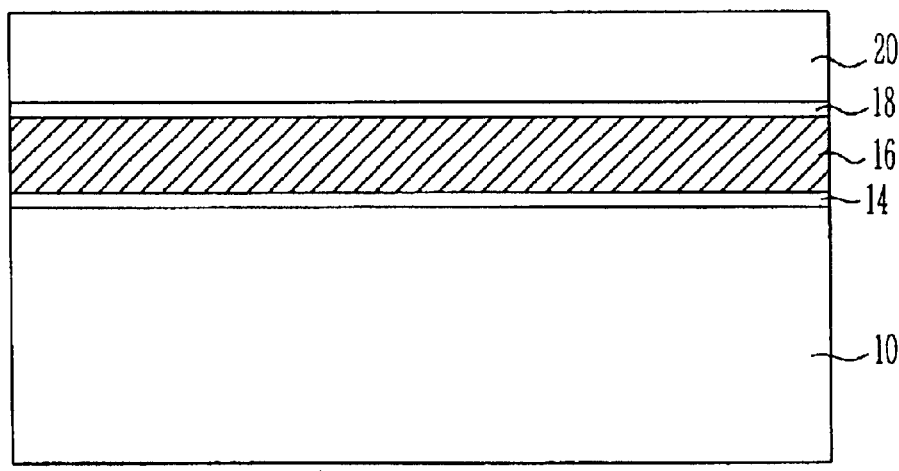

Referring now to FIG. 1B, the buffer oxide film 12 is removed by a cleaning process using DHF or BOE. A tunnel oxide film 14 of 90 through 100 Å in thickness is then formed on portions from which the buffer oxide film 12 is removed.

Next, a lower polysilicon layer for a floating gate 16 (hereinafter called "lower polysilicon layer") of 800 through 1000 Å in thickness is formed on the entire structure. A pad oxide film 18 and a pad nitride film 20 are then sequentially formed on the lower polysilicon layer 16. At this time, the lower polysilicon layer 16 has a stack structure of a doped polysilicon layer and an undoped polysilicon layer. If the lower polysilicon layer 16 is to be formed in thickness of about 800 Å, the doped polysilicon layer is formed in thickness of about 600 Å and the undoped polysilicon layer is formed in thickness of about 200 Å. Further, the pad oxide film 18 is formed in thickness of about 100 Å and the pad nitride film 20 is formed in thickness of about 1200 Å.

Figure 1C:
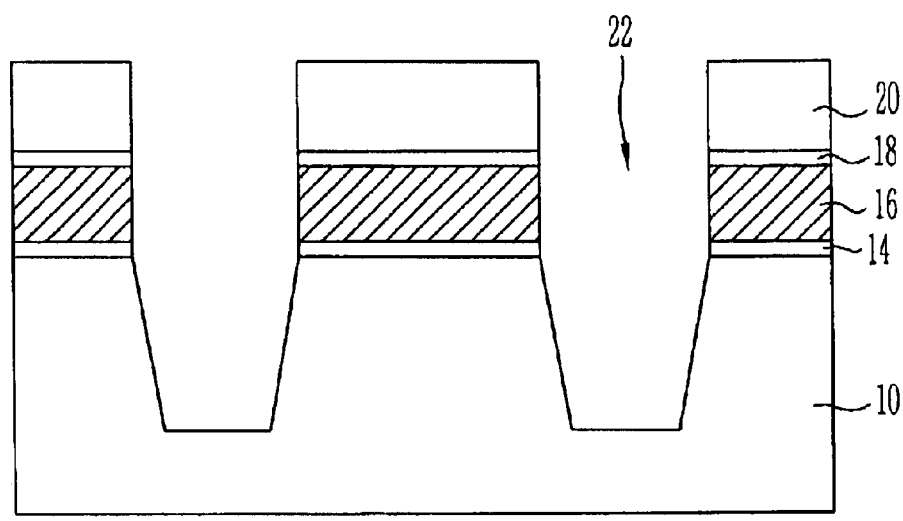

By reference to FIG. 1C, the pad nitride film 20, the pad oxide film 18, the lower polysilicon layer 16 and the tunnel oxide film 14 are sequentially etched by an etch process using an isolation (ISO) mask. Next, the semiconductor substrate 10 is etched to be about 3000 Å in depth, thus forming a trench 22.

Figure 1D:
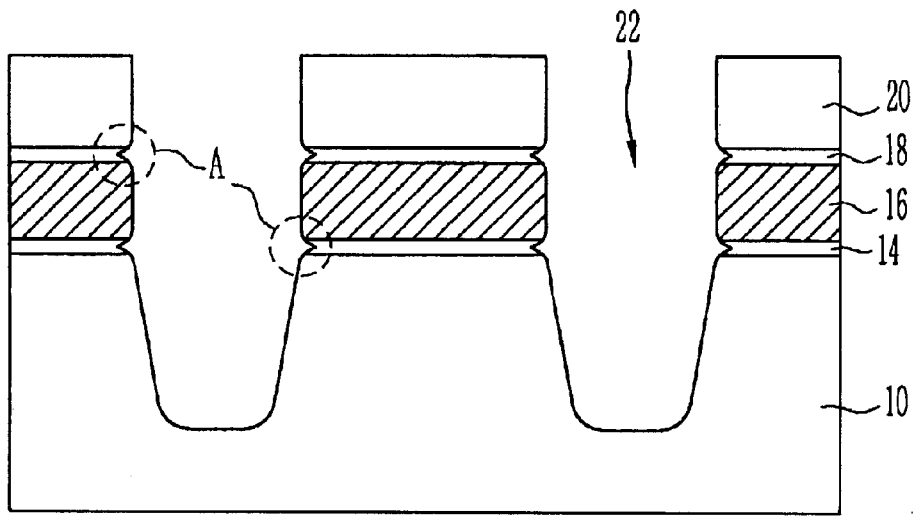

Referring now to FIG. 1D, a sacrifice oxide film (not shown) may be formed by a wall sacrificial (SAC) oxidization process using the dry or wet oxidization process. A wall oxide film (not shown) may be then formed by a wall oxidization process using the dry or wet oxidization process. At this time, the wall SAC oxidization process is performed in order to mitigate a given portion of the semiconductor substrate 10 that is damaged or crystal-dislocated during the etching process for forming the trench 22. Further, the wall oxidization process is performed in order to have an edge of the etched semiconductor substrate 10 rounded.

Thereafter, the dry or wet oxidization process may be performed to form a bird's beak between the lower polysilicon layer 16 and the tunnel oxide film 14, and between lower polysilicon layer 16 and the pad oxide film 20, as shown by 'A'.

Figure 1E:
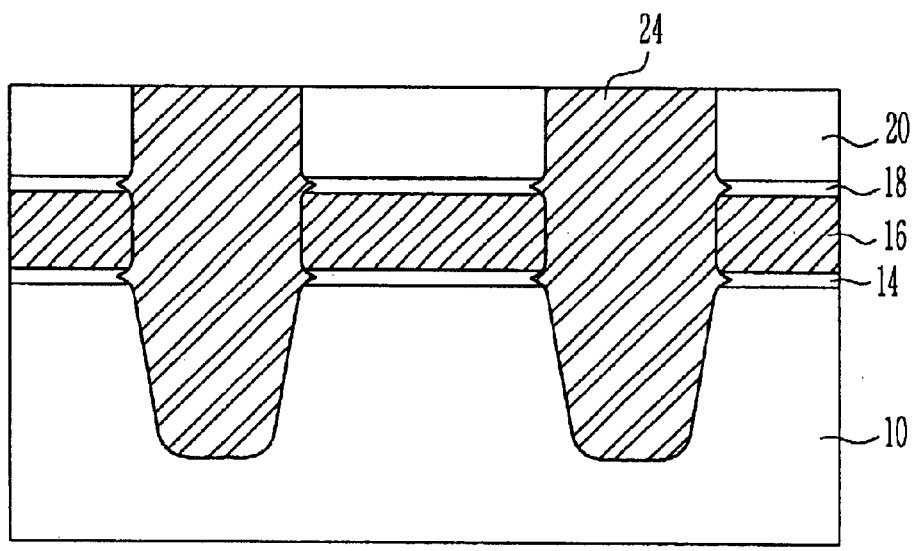

Referring now to FIG. 1E, in order to inject ions into the trench 22, a field blocking implant is performed. In case of a NMOS, the field blocking implant is performed by introducing boron having the dose of about 5E13 ions/cm$^2$ with injection energy of about 20 KeV applied.

Next, high temperature oxide (HTO) using DCS ($SiH_2Cl_2$) as a source gas is thinly deposited on the entire structure. A fineness process is then performed at high temperature to thus form a liner oxide film (not shown). At this time, the fineness process is performed under $N_2$ atmosphere at a temperature ranging from 1000 to 1100° C. for 20 through 30 minutes. The texture of the liner oxide film is made fine by the fineness process, thus increasing the etch resistance. Due to this, it is possible to prohibit generation of a moat occurring upon a STI process and to prevent a leakage current.

Thereafter, the HDP oxide film 24 for a trench insulating film is deposited on the entire structure to have the trench 22 burried. And then the HDP oxide film 24 is planarized by CMP process. At this time, the planarization process is performed so that the thickness of the pad nitride film 20 is about 900 Å. Further, the HDP oxide film for the trench insulating film is formed through a cap filling process, so that void is not generated within the trench 22.

Figure 1F:
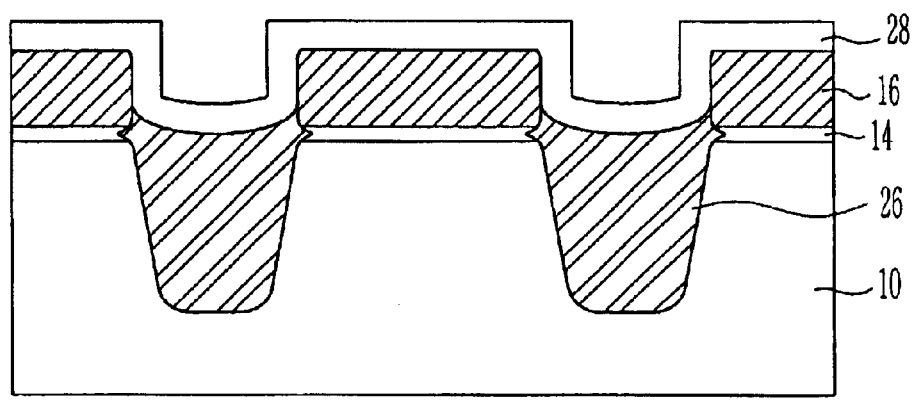

Referring now to FIG. 1F, the entire structure is experienced by an oxide film dry etch process. The oxide film dry etch process is performed under the condition that an etch target is about 1000 Å, the selective ratio between the oxide and the nitride film is about 1:1 and the selective ratio between polysilicon and the oxide film is about 1:10. As above, as the pad nitride film 20 is completely removed, the nitride strip process included in the prior art can be skipped. Further, the dry etch process is performed under the condition that the thickness of the etch target is thicker than that of the remaining pad nitride film 20. Due to this, as the HDP oxide film 24 is over-etched, the device isolation film 26 is formed at a location lower than upper surface of the lower polysilicon layer 16.

Next, the entire structure is experienced by a pre-processing cleaning process using DHF or BOE. The pre-processing cleaning process is performed by setting the etch target to be below 200 Å in thickness and then forming an upper polysilicon layer for a floating gate 28 (hereinafter called "upper polysilicon layer") of 300 through 900 Å in thickness.

Figure 1G:
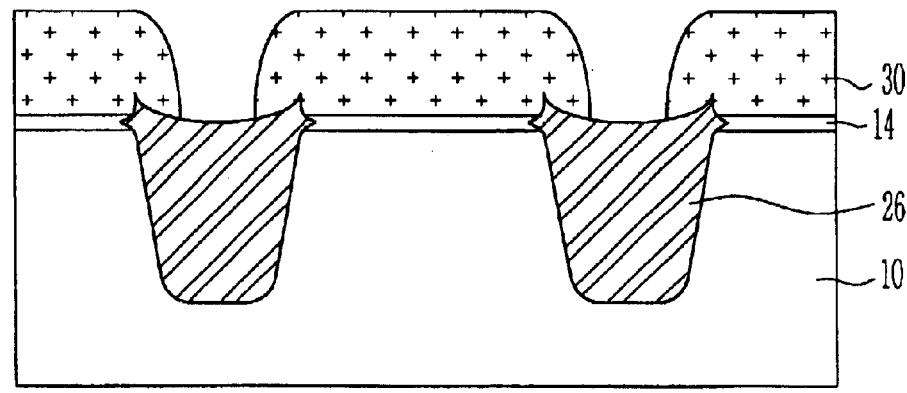

Referring now to FIG. 1G, the upper polysilicon layer 28 is experienced by the unisotropical dry etch process. At this time, the dry etch process is performed by setting the etch target to be same to the deposition thickness of the upper polysilicon layer 28, so that a spacer made of the upper polysilicon layer 28 is formed on the side wall of the lower polysilicon layer 16, and thus a floating gate 30 is formed. Thereby, the space between neighboring floating gates 30 is secured up to 0.1 μm by minimum.

Thereafter, a dielectric film (not shown) of the ONO structure is formed on the entire structure. Next, a polysilicon layer for a control gate of about 2000 Å in thickness is formed on the dielectric film. The subsequent processes are same to the common processes and a detailed explanation of them will not be made.

As mentioned above, according to the present invention, upon formation of a device isolation film, a space of a lower polysilicon layer for a floating gate is defined, a bird's beak is formed on an internal surface of a trench by subsequent wall sacrificial oxidization process and wall oxidization process and an upper polysilicon layer for a floating gate is then formed, so that the spacer of the floating gate is formed. Therefore, the present invention has outstanding advantages that it can reduce the cost since a mask process is not required compared to an existing stepper method and reduce the process cost since a planarization process using chemical mechanical polishing process (CMP) is not required compared to the self-aligned floating mode.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a floating gate in a flash memory device, comprising the steps of:

forming a tunnel oxide film on a semiconductor substrate;

forming a lower polysilicon layer on the tunnel oxide film;

forming a pad oxide film and a pad nitride film on the lower polysilicon layer;

forming a trench on the semiconductor substrate;

sequentially performing a wall sacrificial oxidization process and a wall oxidization process for an internal surface of the trench;

performing an oxidization process for forming bird's beaks between the lower polysilicon layer and the tunnel oxide film and between the lower polysilicon layer and the pad oxide film, thereby forming a first resulting structure;

forming an oxide film on the first resulting structure to bury the trench and then performing a planarization process;

performing a first etch process to remove the pad nitride film and the pad oxide film and simultaneously overetching the oxide film, thereby forming a second resulting structure; and forming an upper polysilicon layer on the second resulting structure and performing a second etch process to form a floating gate.

2. The method as claimed in claim 1, wherein the lower polysilicon layer has a stack structure of a doped polysilicon layer and an undoped polysilicon layer.

3. The method as claimed in claim 2, wherein the doped polysilicon layer is formed in a thickness of about 600 Å and the undoped polysilicon layer is formed in a thickness of about 200 Å.

4. The method as claimed in claim 1, wherein the lower polysilicon layer is formed in a thickness ranging from 800 to 1000 Å.

5. The method as claimed in claim 1, further comprising a step of boron ion implantation process having a dose of about 5E13 ions/cm$^2$ with an injection energy of about 20 Kev applied to the internal surface of the trench, after the trench is formed.

6. The method as claimed in claim 1, further comprising a step of thinly depositing HTO using DCS as a source gas on the internal surface of the trench and then forming a liner oxide film by a fineness process at high temperature, after the trench is formed.

7. The method as claimed in claim 1, wherein the planarization process is performed in a CMP mode by which the pad nitride film of about 900 Å in thickness remains.

8. The method as claimed in claim 1, wherein the first etch process is performed in a dry etch process under a condition that an etch target is about 1000 Å in thickness, a selective ratio of an oxide film and a nitride film is about 1:1 and a selective ratio of polysilicon and the oxide film is about 1:10.

9. The method as claimed in claim 1, further comprising a step of performing a pre-processing process using DHF or BOE for the second resulting structure after the first etch process wherein the pre-processing process is performed by setting the etch target to be below of 200 Å in thickness.

10. The method as claimed in claim 1, wherein the upper polysilicon layer is formed in a thickness ranging from 300 to 900 Å.

11. The method as claimed in claim 1, wherein the second etch process is performed in a dry etch process so that a space of the floating gate is at least 0.1 μm.

* * * * *